(12) United States Patent
Liepa et al.

(10) Patent No.: US 7,948,488 B2
(45) Date of Patent: May 24, 2011

(54) SHAPE PRESERVING MAPPINGS TO A SURFACE

(75) Inventors: Peter E. Liepa, Toronto (CA); Vincent C. H. Ma, Richmond Hill (CA)

(73) Assignee: Autodesk, Inc., San Rafael, CA (US)

( * ) Notice: Subject to any disclaimer, the term of this patent is extended or adjusted under 35 U.S.C. 154(b) by 932 days.

(21) Appl. No.: 11/736,415

(22) Filed: Apr. 17, 2007

(65) Prior Publication Data

US 2008/0259077 A1    Oct. 23, 2008

(51) Int. Cl.
G06T 15/00 (2011.01)
(52) U.S. Cl. .......................... 345/423; 715/799; 715/800
(58) Field of Classification Search .................... None
See application file for complete search history.

(56) References Cited

U.S. PATENT DOCUMENTS

| | | | | |
|---|---|---|---|---|
| 5,107,444 A | * | 4/1992 | Wu | 345/419 |
| 5,255,352 A | * | 10/1993 | Falk | 345/582 |
| 5,910,804 A | * | 6/1999 | Fortenbery et al. | 345/419 |
| 6,300,958 B1 | * | 10/2001 | Mallet | 345/442 |
| 6,891,527 B1 | * | 5/2005 | Chapman et al. | 345/158 |
| 6,907,573 B2 | * | 6/2005 | Kohls et al. | 715/764 |
| 7,034,824 B2 | | 4/2006 | Maillot | |
| 7,133,044 B2 | | 11/2006 | Maillot et al. | |
| 7,479,959 B2 | * | 1/2009 | Han et al. | 345/420 |
| 2004/0001060 A1 | * | 1/2004 | Stollnitz et al. | 345/423 |
| 2004/0051712 A1 | * | 3/2004 | Maillot | 345/423 |
| 2005/0128211 A1 | * | 6/2005 | Berger et al. | 345/582 |
| 2007/0024632 A1 | * | 2/2007 | Couture-Gagnon | 345/581 |
| 2007/0083383 A1 | * | 4/2007 | Van Bael et al. | 705/1 |

OTHER PUBLICATIONS

Desbrun, M. et al., "Intrinsic Parameterizations of Surface Meshes," Eurographics, 21(3), 10 pgs., (2002).

* cited by examiner

*Primary Examiner* — Ulka Chauhan
*Assistant Examiner* — Andrew Yang
(74) *Attorney, Agent, or Firm* — Gates & Cooper LLP

(57) ABSTRACT

A method, apparatus, and article of manufacture provide the ability to map a detail model to a destination while preserving the shape of the detail model. A destination surface (that is a smooth surface) is obtained. The destination surface is tessellated to generate a mesh representation of the destination surface. A parameterization of the mesh representation is then generated. Reverse mapping is conducted from a point of a detail model surface to a point of the destination surface via the parameterization and mesh representation.

31 Claims, 7 Drawing Sheets

SHAPE PRESERVING MAPPINGS TO A SURFACE

CROSS-REFERENCE TO RELATED APPLICATIONS

This application is related to the following commonly-assigned patents, which patents are incorporated by reference herein:

U.S. Pat. No. 7,133,044, entitled "SYSTEM OF FEATURE-BASED SURFACE MAPPING", by Jerome Maillot and Xiaohuan Wang, issued on Nov. 7, 2006; and U.S. Pat. No. 7,034,824, entitled "SYSTEM AND METHOD FOR COMPUTING A CONTINUOUS LOCAL NEIGHBORHOOD AND PARAMETERIZATION", by Jerome Maillot, issued on Apr. 25, 2006.

BACKGROUND OF THE INVENTION

1. Field of the Invention

The present invention relates generally to three-dimensional (3D) modeling, animation, effects, and rendering applications, and in particular, to a method, apparatus, and article of manufacture for preserving the shape of an object when mapping an object to a surface in a 3D model.

2. Description of the Related Art

In 3D modeling, animation, effects, and rendering applications, it is desirable to place and display one object (referred to as a detail model) onto another object (referred to as a destination). For example, a company logo may be copied or placed onto the front hood of an automobile or the side of a shoe. In another example, a semi-soft rubber disc may be wrapped around a cylindrical surface. With such an application/effect, it may be desirable for the detail model to conform to a curved destination surface yet retain its detail model proportions. However, in the prior art, such shape preservation was not possible. Such problems may be better understood with a description of prior art mapping applications.

It is well known that in general a curved surface cannot be flattened to a planar surface without either distortion or tearing. The converse is also true: that a planar surface cannot be mapped to a curved surface without distortion or tearing. The mapping distortion can be managed in various ways. A conformal mapping (also referred to as a shape preserving mapping), for example, locally preserves shape. A shape preserving mapping is a map of one region to another that is one-to-one and continuous and such that angles are preserved. In particular, maps that preserve the form (or shape) of small-scale features are called "conformal" or "shape preserving". References herein to shape preservation and shape distortion are construed at small or local scales. At large scales, shape preservation is generally not possible.

Given a 3D detail model that is defined over a reference plane, the prior art is unable to create a copy of the detail model that conforms to a curved destination yet retains the original detail model proportions. While prior art applications may allow for the projection or mapping of a detail model plane to a destination surface (e.g., via a UV parameterization of the destination surface), such a parameterization may not provide for shape preserving mapping. Accordingly, undesirable distortions may result. For example, a 3D detail model geometry may be applied to a destination surface using the existing parameterization of the destination surface. If such an original parameterization is not shape preserving, shape distortion will result. Further, the entire detail model would distort based on the use of the original parameterization. The Rhinoceros™ NURBS modeling for Windows™ application (referred to herein as Rhino™) provides such a mapping with shape distorting results.

Alternative prior art applications (e.g., Autodesk™ ImageStudio available from the assignee of the present invention) may provide the ability to map a texture to a surface (such workflow referred to as "decal mapping") in a shape preserving manner. However, the destination surface is first tessellated into a mesh and it is not possible to map the detail model decal to the original smooth surface. In other words, the detail model decal is mapped onto the tessellated surface. However, when mapping to a mesh, a very detailed, refined tessellation is necessary to accurately represent the original destination surface. Such a fine mesh may require tens or hundreds of thousands of triangles resulting in slow processing and problems with the high volume of data that is being used. In addition, since a mesh is a non-smooth surface (i.e., it is piecewise linear), any mapping or display that utilizes such a mesh may result in artifacts.

In addition, the prior art may utilize texture mapping that often relies on a particular graphics engine, rendering software, or hardware graphics processing unit (GPU). Such a reliance limits the flexibility of the application and does not allow the use of new or different parameterizations for a destination surface. Further, such texture mapping does not provide the ability to map a 3D detail model (i.e., geometry) onto a smooth destination surface. Instead, prior art texture mapping is limited to a 2D texture map detail model, or, at best, the conversion of 2D texture into surface displacement (known as displacement mapping).

SUMMARY OF THE INVENTION

Given a three dimensional detail model that is defined over a reference plane, one or more embodiments of the invention solve the problem of creating a copy of the detail model that conforms to a curved destination surface yet retains the original detail model proportions. As an example of this workflow, a company logo might be copied to the front hood of a car or the side of a shoe.

As described above, there is an obvious mapping from a plane of a detail model to a destination surface via the intrinsic UV parameterization of the destination surface. However, this parameterization does not necessarily lead to a shape preserving mapping, and will generally introduce undesirable distortions. Prior art solutions fail to provide shape preserving mapping with geometries wherein a detail model is mapped to an original smooth destination surface.

In one of more embodiments of the invention, the destination surface is tessellated into a mesh, then the mesh is flattened using known techniques that optimize shape preservation. This flattening defines a mapping from the reference plane (and its ambient space) back to the destination surface (and its ambient space). The mapping is defined from the flattened triangles to the triangles of the destination surface tessellation, and then as a projection (or a closest point determination) from the tessellation triangles to the destination surface.

Additional embodiments of the invention provide and enable a user interface consistent with the shape preserving mapping capabilities. For example, embodiments may enable scaling, rotating, translating and elevating the copy of the detail model on the destination surface; letting the copy move partially beyond the boundary of the destination surface;

dealing with several destination surfaces; and performing similar operations with destination curves instead of surfaces.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Given a destination surface and a tessellation of said destination surface, and a parameterization of said tessellation: one or more embodiments of the invention calculate a map from the (u,v) plane that, as its final step, calculates a projection (or closest point determination) from said tessellation to the original destination surface. Additional maps are created from a detailed model surface to the destination space/surface based on the mapping.

Hardware and Software Environment

Figure 1:
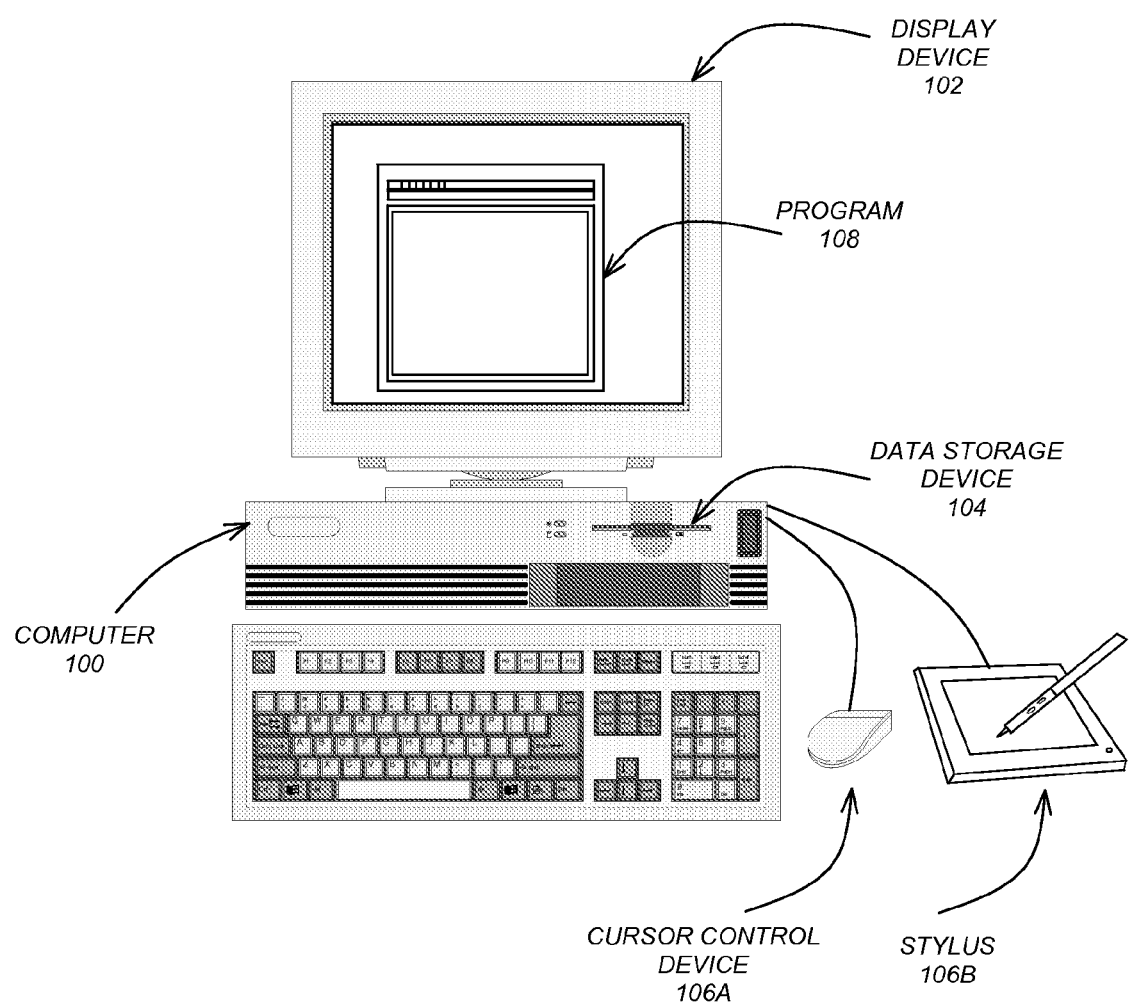
FIG. 1 is an exemplary hardware and software environment used to implement one or more embodiments of the invention.

FIG. 1 is an exemplary hardware and software environment used to implement one or more embodiments of the invention. Embodiments of the invention are typically implemented using a computer 100, which generally includes, inter alia, a display device 102, data storage device(s) 104, cursor control devices 106A, stylus 106B, and other devices. Those skilled in the art will recognize that any combination of the above components, or any number of different components, peripherals, and other devices, may be used with the computer 100.

One or more embodiments of the invention are implemented by a computer-implemented program 108 (or multiple programs 108). Such a program may be a 3D modeling application, animation application, effects application, rendering applications, or any type of program that executes on a computer 100. The program 108 may be represented by one or more windows displayed on the display device 102. Generally, the program 108 comprises logic and/or data tangibly embodied in or readable from a device, media, or computer-readable medium, e.g., data storage device 104, which could include one or more fixed and/or removable data storage devices 104, such as a zip drive, floppy disc drive, hard drive, CD-ROM drive, tape drive, etc. connected directly or indirectly to the computer 100, one or more remote devices coupled to the computer 100 via a data communications device, etc. Further, the graphics program 108 is comprised of instructions which, when read and executed by the computer 100, causes the computer 100 to perform the steps necessary to implement and/or use the present invention.

In addition, program 108 (or other programs described herein) may be an object-oriented program having objects and methods as understood in the art. Further, the program 108 may be written in any programming language including C, C++, C#, Pascal, Fortran, Java™, etc. Further, as used herein, multiple different programs may be used and communicate with each other. In addition, the graphics program 108 may be implemented in a variety of environments including as an independent stand-alone application, an Internet application or service, or a distributed application.

Graphics program 108 and/or operating instructions may also be tangibly embodied in a memory and/or data communications devices of computer 100, thereby making a computer program product or article of manufacture according to the invention. As such, the terms "article of manufacture" and "computer program product" as used herein are intended to encompass a computer program accessible from any computer readable device or media.

Figure 2:
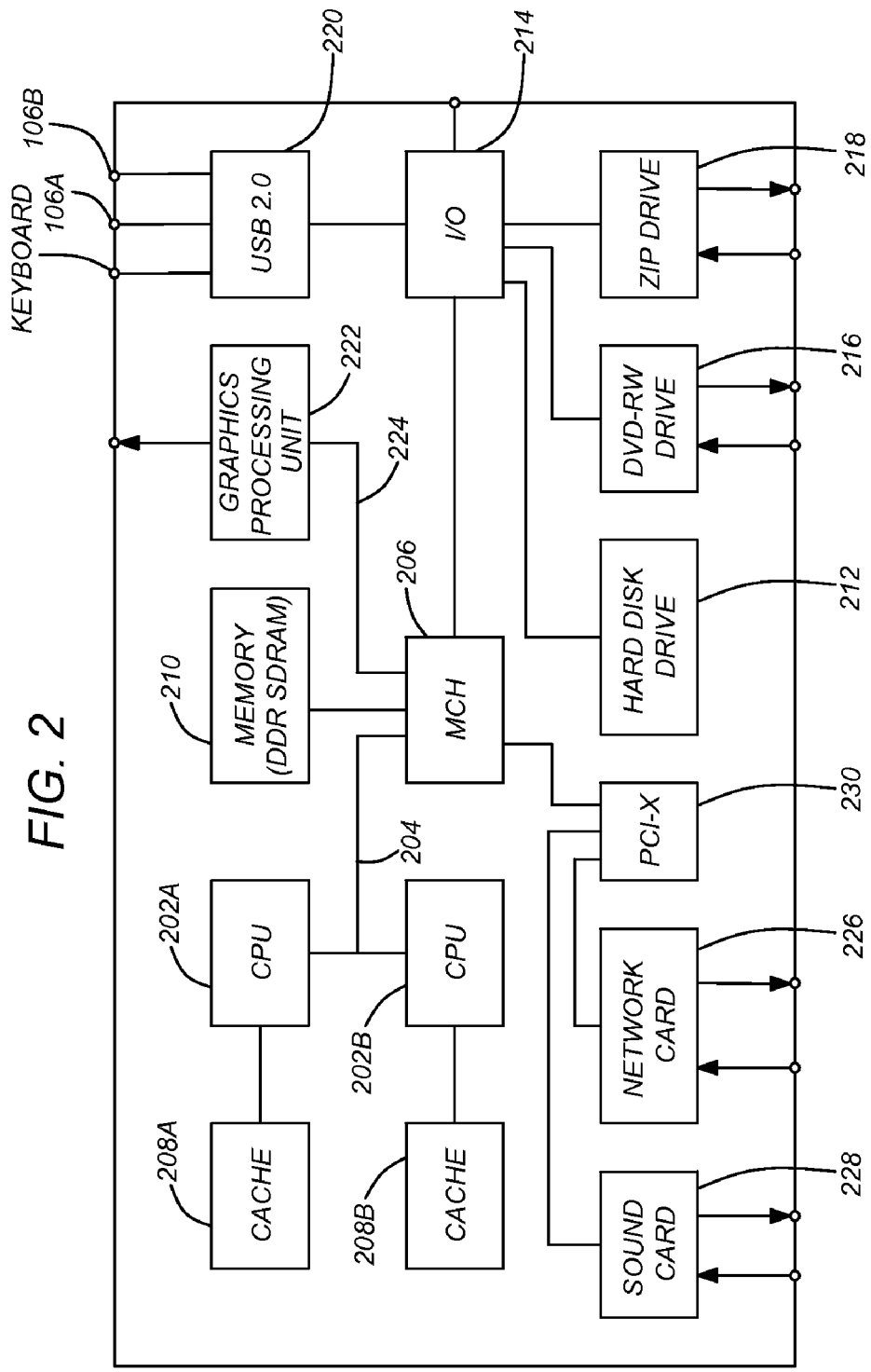
FIG. 2 illustrates details of a hardware computer system in accordance with one or more embodiments of the invention.

The components of computer system 100 are further detailed in FIG. 2 and, in one or more embodiments of the present invention, said components may be based upon the Intel® E7505 hub-based chipset.

The system 100 includes two central processing units (CPUs) 202A, 202B (e.g., Intel® Pentium™ Xeon™ 4 DP CPUs running at three Gigahertz, or AMD™ CPUs such as the Opteron™/Athlon X2™/Athlon™ 64), that fetch and execute instructions and manipulate data via a system bus 204 providing connectivity with a Memory Controller Hub (MCH) 206. CPUs 202A, 202B are configured with respective high-speed caches 208A, 208B (e.g., that may comprise at least five hundred and twelve kilobytes), which store frequently accessed instructions and data to reduce fetching operations from a larger memory 210 via MCH 206. The MCH 206 thus co-ordinates data flow with a larger, dual-channel double-data rate main memory 210 (e.g., that is between two and four gigabytes in data storage capacity) and stores executable programs which, along with data, are received via said bus 204 from a hard disk drive 212 providing non-volatile bulk storage of instructions and data via an Input/Output Controller Hub (ICH) 214. The I/O hub 214 similarly provides connectivity to DVD-ROM read-writer 216 and ZIP™ drive 218, both of which read and write data and instructions from and to removable data storage media. Finally, I/O hub 214 provides connectivity to USB 2.0 input/output sockets 220, to which the stylus and tablet 106B combination, keyboard, and mouse 106A are connected, all of which send user input data to system 100.

A graphics card (also referred to as a graphics processing unit [GPU]) 222 receives graphics data from CPUs 202A, 202B along with graphics instructions via MCH 206. The GPU 222 may be coupled to the MCH 206 through a direct port 224, such as the direct-attached advanced graphics port 8X (AGP™ 8X) promulgated by the Intel® Corporation, or the PCI-Express™ (PCIe) x16, the bandwidth of which may exceed the bandwidth of bus 204. The GPU 222 may also include substantial dedicated graphical processing capabilities, so that the CPUs 202A, 202B are not burdened with computationally intensive tasks for which they are not optimized.

Network card 226 provides connectivity to a framestore by processing a plurality of communication protocols, for instance a communication protocol suitable to encode and send and/or receive and decode packets of data over a Gigabit-Ethernet local area network or the Internet. A sound card 228 is provided which receives sound data from the CPUs 202A, 202B along with sound processing instructions, in a manner similar to GPU 222. The sound card 228 may also include substantial dedicated digital sound processing capabilities, so that the CPUs 202A, 202B are not burdened with computationally intensive tasks for which they are not optimized. Network card 226 and sound card 228 may exchange data with CPUs 202A, 202B over system bus 204 by means of a controller hub 230 (e.g., Intel®'s PCI-X controller hub) administered by MCH 206.

Those skilled in the art will recognize that the exemplary environment illustrated in FIGS. 1 and 2 are not intended to limit the present invention. Indeed, those skilled in the art will recognize that other alternative environments may be used without departing from the scope of the present invention.

Software Environment

As described above, graphics program 108 may comprise a 3D modeling, animation, effects, and/or rendering application (referred to herein collectively as a graphics program 108). Graphics program 108 may be configured to cause a computer to display certain objects and/or renderings on a display device. The forthcoming description will first present the graphical user interface (GUI) that may be displayed by one or more embodiments of the invention followed by a description of the technical capabilities that enable such a user interface.

User Interface

Figure 3:
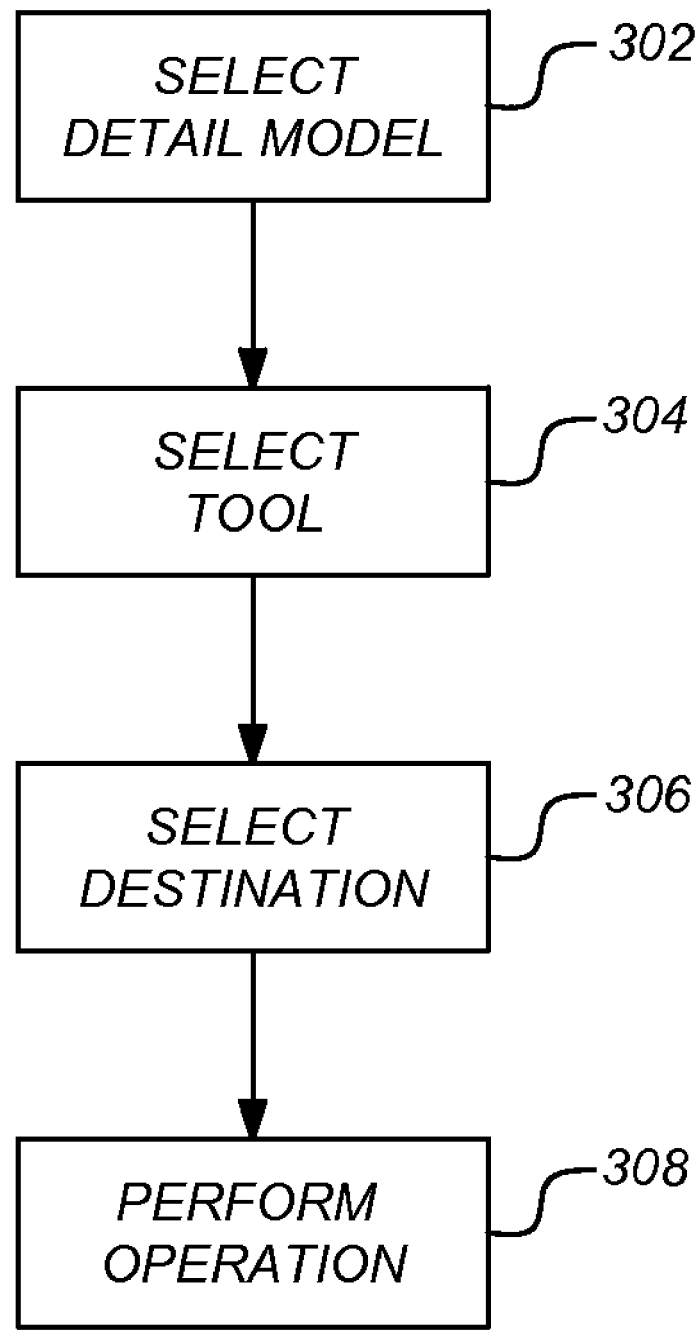
FIG. 3 illustrates a flow chart for utilizing a tool to perform a mapping to a surface in accordance with one or more embodiments of the invention.

FIG. 3 illustrates a flow chart for utilizing a tool to perform a mapping to a surface in accordance with one or more embodiments of the invention.

A tool/widget referred to as a Conform Rig enables a user to perform modeling operations that are similar to "badging," or deforming a feature defined over a flat base onto a curved surface so that the output conforms to the shape of the curved surface. Another way to view such a tool is that the tool is a 3d texture mapping tool, where the idea of texture mapping is used to map a texture with thickness.

To begin use of the Conform Rig tool, the user first selects the geometry to be modified, or conformed at step 302. Such geometry is referred to as a detail model and can be a spline surface (including NURBS [Non-Uniform Rational B-Spline] and Bezier surfaces), subdivision surface, implicit surface, algebraic surface, procedural surface, mesh surface, solid, volume, curve, point, multiple surfaces, collections of contiguous surfaces, and any other surface(s), curve(s), point(s), solid(s) or volume(s). The invention is intended to include any such type of geometry or surface whether described herein or otherwise.

At step 304, the user selects the Conform Rig tool. For example, the user may use a menu to select "Object Edit>Conform Rig" or alternatively, a right mouse click may activate a menu choice for selecting the Conform Rig tool. Alternatively, any known mechanism may be used to select/activate the tool. Once the tool has been selected, the detail model geometry may be accepted and highlighted in some manner (e.g., displayed in a pale green [or other color] highlight). Any mechanism or display tool available may be used to differentiate the accepted detail model geometry from the remaining displayed geometry/objects.

At step 306, one or more surfaces, or a single mesh, or a single curve on any surface (isoparms, trim boundaries, curves-on-surface, trim mesh, patch precision lines), or a locator point on a surface is selected as the destination. The destination is the geometry onto which the detail models are to be mapped. Once a destination has been selected, the user may be prompted to accept the conform destination or to finalize the conform operation. In the case of the destination being a surface curve or a surface point, the detail model will still be mapped onto the surface to which these entities belong. The curve or point merely acts as a constraint on the placement of the detail model. It may be noted that the process for selecting the detail model surface, selecting a tool to perform the conform operation, the user selecting the destination surface, and the displaying of the detail model surface mapped to the destination surface may be performed in any temporal order. The destination surface can be a spline surface (including NURBS [Non-Uniform Rational B-Spline] and Bezier surfaces), subdivision surface, implicit surface, algebraic surface, procedural surface, mesh surface, boundary surface (of a solid or volume), curve, multiple surfaces, collections of contiguous surfaces, and any other surface(s) or curve(s). All such surface(s) can be tessellated (e.g., the tessellation of a mesh is the mesh itself). The invention is intended to include any such type of geometry or surface whether described herein or otherwise.

Once the user has elected to proceed, the Conform operation takes the detail model geometry and, as if it was a thick stamp, applies it onto the destination surface at step 308. Such a "stamp" may be required to initially lie parallel to the X-Y plane. In this regard, the reference plane may default to the X-Y plane, and can later be changed by the user.

FIGS. 4-8 illustrate the graphical user interface displayed when mapping a detail model to a destination in accordance with one or more embodiments of the invention.

Figure 4:
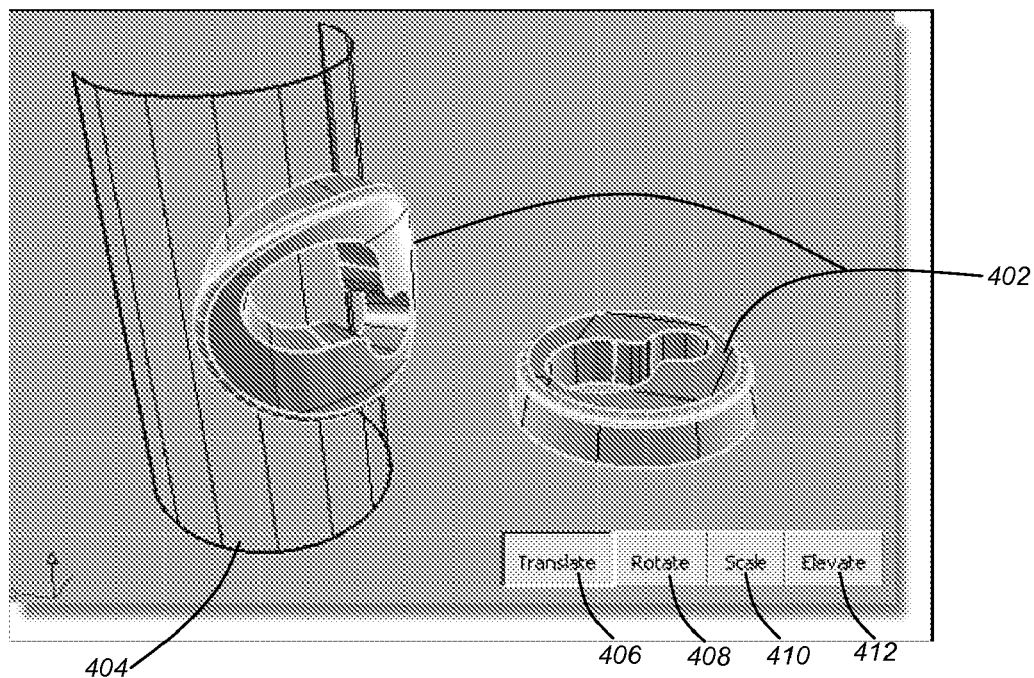
FIG. 4 illustrates a display after the user has completed the steps of FIG. 3 and the detail model has been mapped to the destination in accordance with one or more embodiments of the invention.

FIG. 4 illustrates a display after the user has completed the steps of FIG. 3 and the detail model has been mapped to the destination in accordance with one or more embodiments of the invention. In FIG. 4, the detail model 402 is the round feature on the right and the destination 404 is the half-cylinder surface on the left. The conformed detail model 402 is shown applied on the destination 404, and has been deformed in order to fit the shape of the destination 404.

By default, the Conform Rig tool preserves the size and length of the detail model 402, and also the shape of the detail model 402. The Conform Rig tool may also be designed to retain the shape of the detail model 402 footprint. In FIG. 4, the top of the detail model 402 has been stretched. Embodiments of the invention may provide an option to modify/change how the detail model 402 stretches. In this regard, both the thickness and footprint may operate independently of each other (or together) and a user may establish/control such a setting and operation.

Inside the Conform Rig tool, the user may be permitted to adjust how the detail models 402 are mapped to the destination 404. Using the various buttons 406, 408, 410, and 412 at the bottom of the modeling window, the user may elect to be in translate 406, rotate 408, scale 410, or elevate 412 mode. Each mode may update and perform the desired operation dynamically in real time.

In translate 406 mode, the user may choose the position of the detail model 402 with respect to the destination 404. Each set of detail models 402 defines a point called the base point, which is the midpoint of the base of the bounding box surrounding the detail models 402. The translation is based on the base point of the detail model 402. When the destination 404 is an entire surface or a mesh or a set of stitchable surfaces, this base point can be positioned at any point on the destination 404. Otherwise, if the destination 404 is a surface curve, the base point is constrained to move along the curve. If the destination 404 is a single surface point, the detail model 402 cannot be moved at all. However, if the surface point itself is moved, the detail model 402 will follow.

Figure 5:
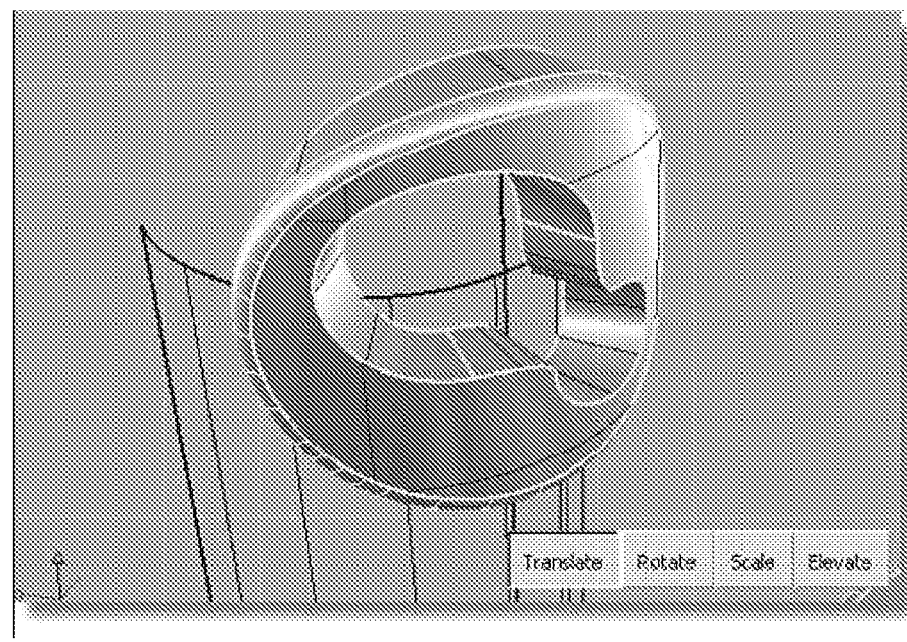
FIG. 5 illustrates a tangential extrapolation in accordance with one or more embodiments of the invention.

Furthermore, if the destination 404 is a surface curve, regular snapping (using one of three tools) may be available. For example, the user can snap the base point to the associated curve division, curve intersection, etc. Using the surface curve as the conform destination 404 allows for precise placement of the detail model 402 on the destination 404. If there are parts of the detail model 402 that extend beyond the boundaries of the destination 404, the tool extrapolates with respect to the destination 404. FIG. 5 illustrates a tangential extrapolation in accordance with one or more embodiments of the invention.

Figure 6:
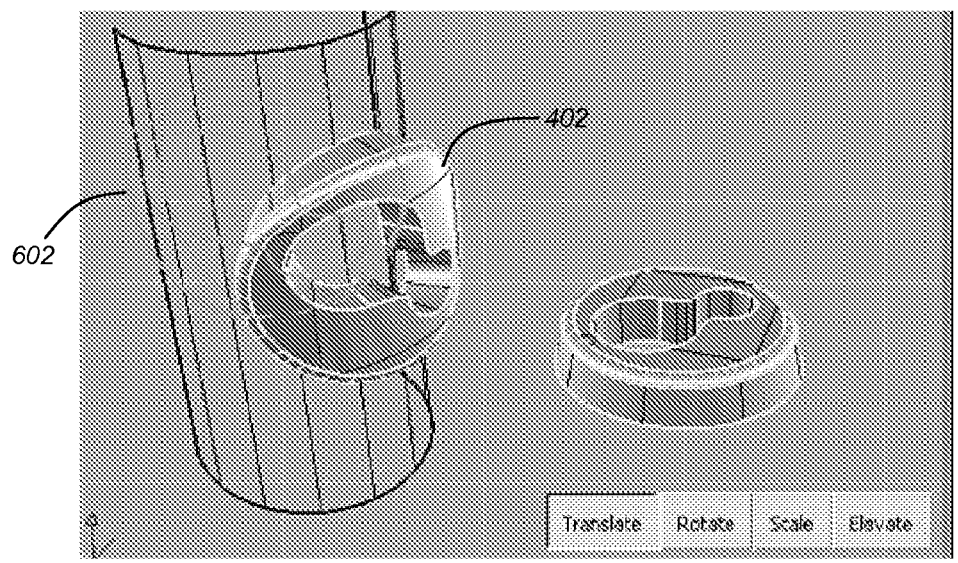
FIG. 6 illustrates a proxy for a detail model in accordance with one or more embodiments of the invention.

To translate the detail model 402 on the destination 404, the user selects/clicks the translate button 406 and click-drags along the destination 404 surface—the detail model 402 follows. While dragging, a highlighting (e.g., a bright green outline) may be visibly displayed. Such highlighting may be a proxy that represents a lightweight approximation of the detail model 402. The proxy allows for real-time interactive updates. The detail models 402 may actually update (e.g., in accordance with a finalized proxy) when the user releases the mouse button. FIG. 6 illustrates a proxy 602 for the detail model 402 in accordance with one or more embodiments of the invention.

The rotate 408 mode may be used to rotate the detail model 402 about the base point of the detail model 402 on the destination 404. The user may click-drag any mouse button to the left or right to adjust the angle. The detail model 402 appears to be spinning in place. The user may also type in the angle in relative (REL) or absolute (ABS) forms.

Figure 7:
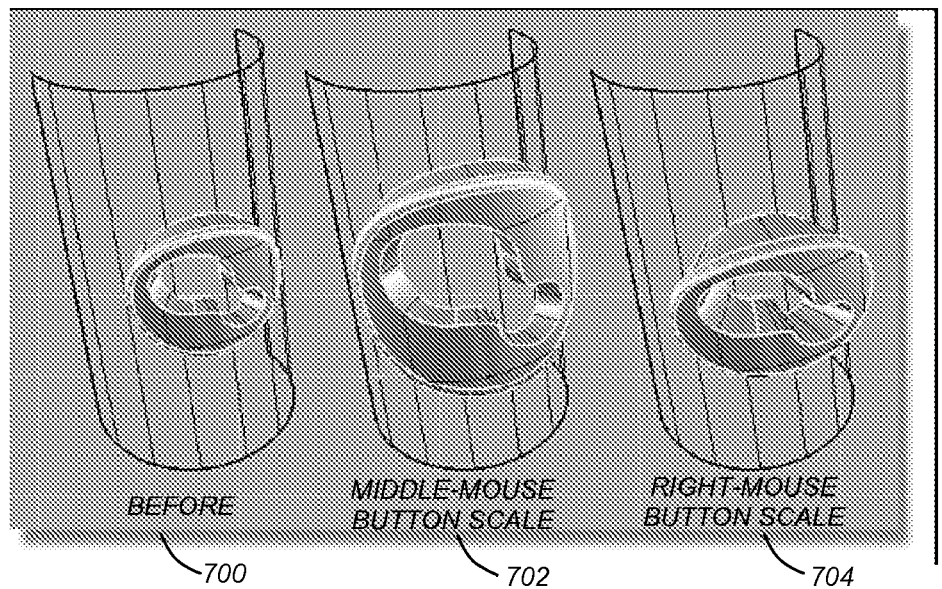
FIG. 7 illustrates the use of a scale mode in accordance with one or more embodiments of the invention.

FIG. 7 illustrates the use of the scale mode in accordance with one or more embodiments of the invention. The scale 410 mode may be used to adjust the size of the detail model 402 relative to the destination 404. Again, if the detail model 402 is scaled to extend beyond the destination 404, the tool extrapolates tangentially. Item 700 of FIG. 7 illustrates the display of a detail model 402 and destination 404 before scaling. The left mouse button may be used to scale (click-drag to the left or right) the detail model 402 proportionally. The middle mouse button may be used to scale along the destination 404 surface (making the detail model 402 bigger but not thicker) (see 702). The right mouse button may be used to scale how thick the detail model 402 becomes (see 704).

The surface of the detail model 402 on the right at 704 shows a tall version of the detail model 402, and also shows how conform works. By default, the conform tool uses the local surface normal of the destination 404 to determine how to map the higher parts of the detail model 402, and for destinations 404 that are very curved, the local surface normals may introduce distortions by stretching the top of the detail model 402 because the normal directions diverge.

A Conform Control option window may have a Parallel normal mode slider that provides the ability to adjust or select the destination 404 normal that is utilized. By default, the mode slider may have a value of 0.0, meaning that 100% of the local normal of the destination 404 is used. A value of 1.0 means the normal of the destination 404 found at the center of the detail model 402 will be used universally. The result is that the sides of the detail model 402 appear parallel. The user may also be permitted to use the slider to blend between the two effects. Accordingly, embodiments of the invention display a slider tool that enables the user to adjust a level of shape preservation of the detail model surface based on a local destination surface normal and a universal destination surface normal.

Figure 8:
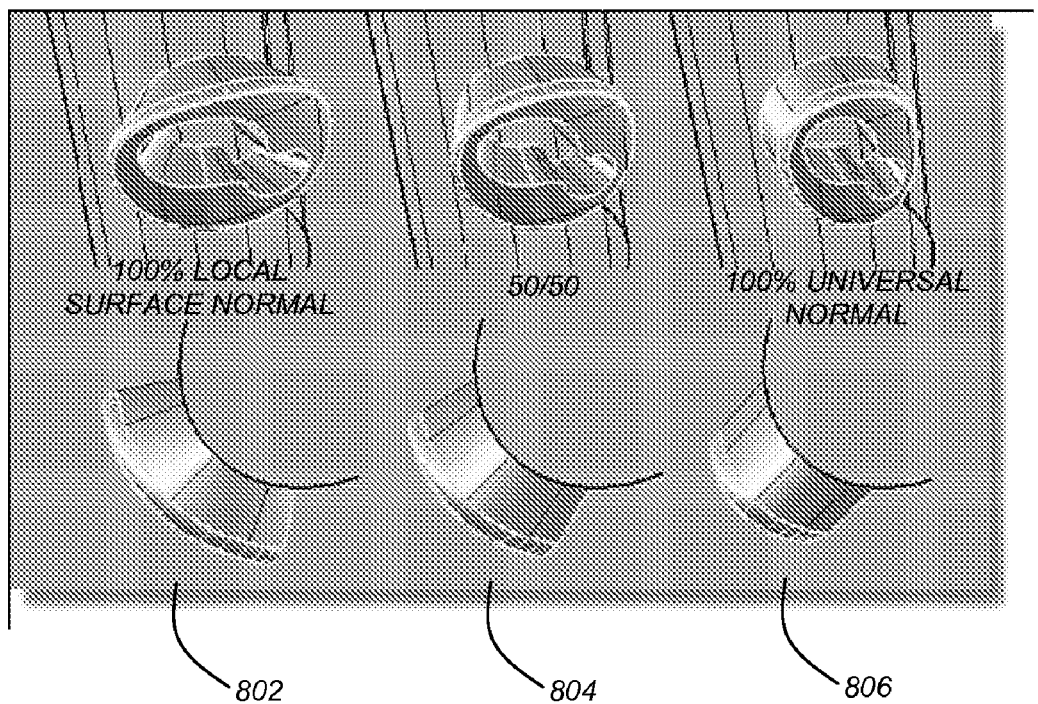
FIG. 8 illustrates different settings for a surface normal in accordance with one or more embodiments of the invention.

FIG. 8 illustrates different settings for the surface normal in accordance with one or more embodiments of the invention. At 802, the surface normal slider is set to utilize 100% of the local surface normal. As illustrated, the surface normals of the destination 404 where the detail model 402 establishes contact are utilized to determine how the detail model 402 is stretched/distorted. The lower portion of FIG. 8 illustrates the diverging normals. Similarly, at 806, the surface normal slider is set to utilize a single universal normal. As illustrated in the lower portion of FIG. 8, each of the surface normals are parallel based on a single normal from the center of detail model 402. With such a setting, the top of detail model 402 will likely retain its shape. The user may also desire to use a semi-parallel surface normal mode as illustrated at 804 wherein the slider is set to utilize 50% of the local surface normal and 50% of the universal surface normal. With such a setting, the application may provide a weighted blending of the universal surface normal and local surface normal based on the position of a slider and/or the setting. Such a blending provides for a smooth mapping between the local surface normal and the universal surface normal.

In view of the above, the (smooth) destination surface 404 has intrinsic normals at each point. However, the user may specify (as indicated above), when the detail model 402 is mapped to destination space 404, that points be positioned with respect to the destination surface 404 using either a universal normal, or a blend between intrinsic normals and the universal normal. As used herein, the direction used at a destination surface point is referred to as the assigned normal for the point.

Figure 9:
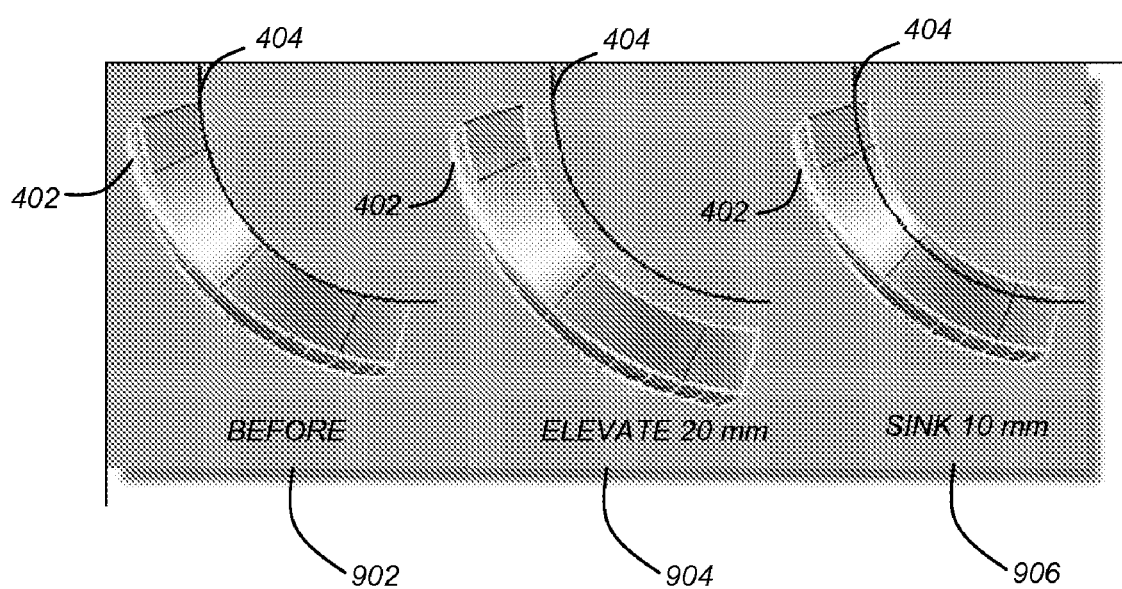
FIG. 9 illustrates a graphical user interface of an elevate mode in accordance with one or more embodiments of the invention.

The elevate 412 mode may be utilized to lift the detail models 402 up and away from the destination 404, or lower and sink the detail model 402 into the surface destination 404. When in elevate mode, the user may merely click-drag up and down to select/identify the desired elevation. The user may also be provided with the option to type or enter the elevation value in either absolute mode or relative mode, using the current linear unit. FIG. 9 illustrates the graphical user interface of the elevate 412 mode in accordance with one or more embodiments of the invention. Area 902 illustrates the detail model 402 and destination 404 before using the elevation 412 mode. Area 904 illustrates the elevation of the detail model 402 twenty (20) mm from the destination 404. Area 906 illustrates the sinking of the detail model 402 ten (10) mm into the destination 404.

The conform tool respects the orientation of the destination 404 surface. Initially, the detail model 402 is conformed to the outward facing side of the destination 404 surface. If the detail model 402 needs to be on the reverse side of the destination 404 surface, the user may select/click a Flip button, or select/click Revert (e.g., from a menu option or other keyboard control) and reverse the orientation of the destination 404 surface before reapplying the Conform tool.

In addition, after a detail model 402 has been conformed to a destination 404, the user can proceed to modify the destination 404 surface in any way, and the conformed detail models 402 may dynamically and automatically (and without user input) update based on a construction history of the conformation operation. The user may also modify the input detail model 402 geometry and the conformed detail models 402 may update accordingly (e.g., dynamically and without user input).

Technical Capabilities

The description above sets forth a user interface for practicing one or more embodiments of the invention. The description herein describes the technical capabilities that enable the user interface.

Figure 10:
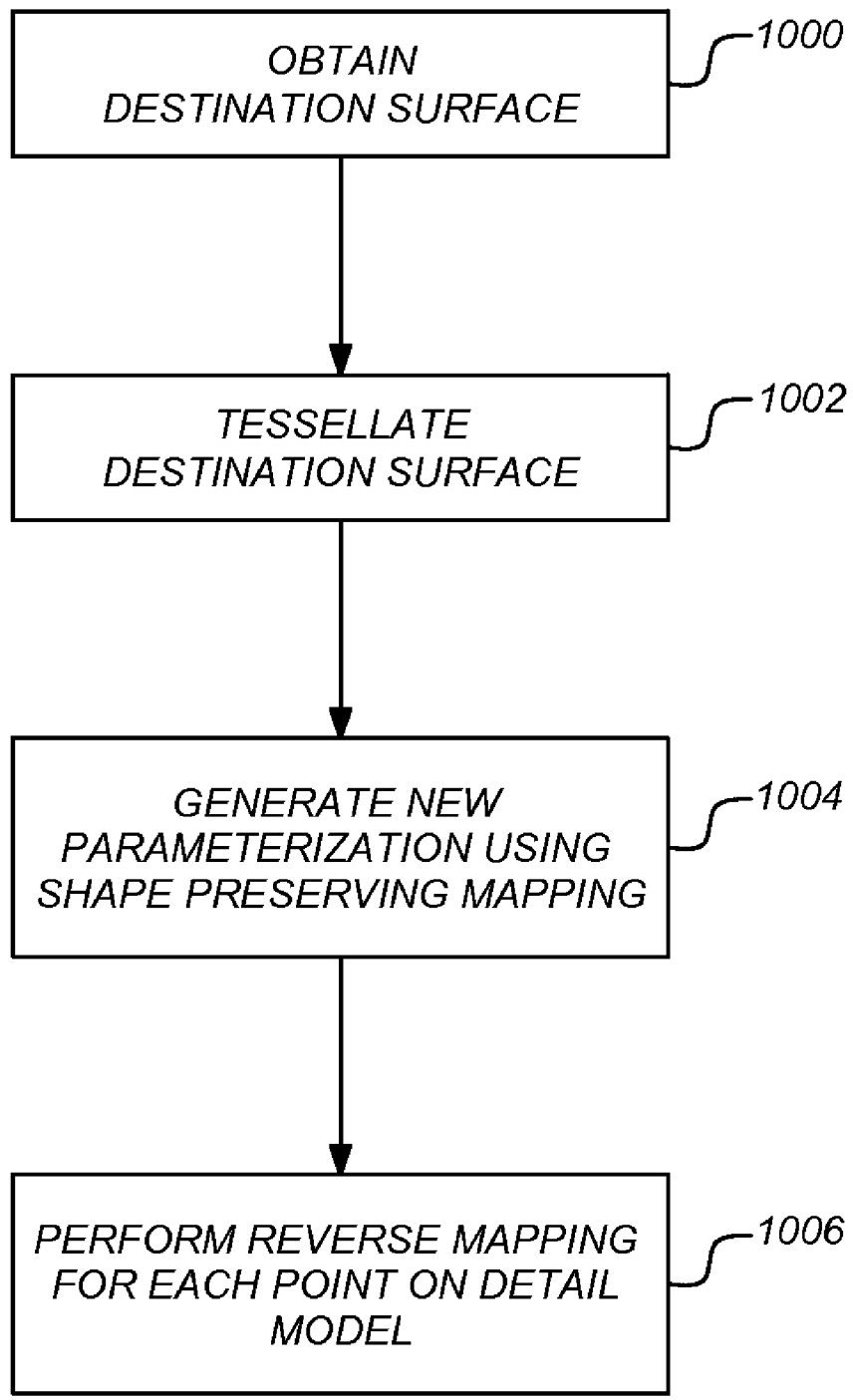
FIG. 10 illustrates the logical flow for enabling the shape preserving mappings in accordance with one or more embodiments of the invention.

FIG. 10 illustrates the logical flow for enabling the shape preserving mappings in accordance with one or more embodiments of the invention. At step 1000, a destination 404 surface is obtained. In this regard, the destination 404 surface may be obtained in response to the user selecting the destination at step 306 of FIG. 3. As described above, such a destination 404 surface may comprise a smooth (e.g., parametric) surface such as a spline surface, subdivision surface, implicit surface, smooth surface, etc. Accordingly, the original destination 404 surface may have an intrinsic parameterization that describes the surface 404. Such an intrinsic parameterization may be non-uniform thereby resulting in distortion if used during a mapping operation.

At step 1002, the destination surface 404 is tessellated to create/generate a mesh representation of the (smooth) destination surface 404.

At step 1004, a new parameterization of the tessellated destination 404 (i.e., the mesh) is generated. The new parameterization is unrelated to the (original) intrinsic parameterization, and provides a new UV coordinate for every vertex of the mesh. Mesh parameterization can be interpreted as a flattening operation. For example, if the UV coordinate is a point on the XY-plane, since every mesh vertex has a new UV coordinate that can be mapped to an XY position, the result is a flattening of the curved mesh surface. Accordingly, the end result of step 1004 is a flat/planar version of the mesh. In one or more embodiments, the parameterization method creates a shape preserving mapping between the curved and flattened meshes.

Shape preserving mapping is one technique that may be used to perform such a flattening. However, other methods may be used to flatten the mesh and/or generate the new parameterization. As used herein, a shape preserving map is a function that preserves angles. More formally, a map $w=f(z)$ is called conformal (or shape preserving or angle-preserving) at $z_0$ if it preserves oriented angles between curves through $z_0$. For smooth surfaces, shape preserving maps preserve both angles and the shapes of infinitesimally small figures, but not necessarily their size. For mesh surfaces, angles and small shapes are approximately preserved, but not their size. Thus, conformal or shape preserving mapping refers to a mathematical technique used to convert (or map) one mathematical surface (and or mesh) into another (e.g., the new parameterization). Shape preserving mapping techniques are known in the art and are used herein in accordance with such known techniques. In this regard, such shape preserving mapping techniques are described in Intrinsic Parameterization of Surface Meshes, Desbrun, Meyer, and Alliez, Eurographics 2002, Volume 21 (2002), Number 3, which is fully incorporated by reference herein.

At step 1006, a reverse mapping is defined from the new parameterization to the destination surface (e.g., via the parameterization and mesh representation). In this regard, step 1006 may be viewed as a process wherein the detail model 402 is overlayed onto the flattened mesh and for every point of the detail model surface 402 (e.g., each point of the detail model 402 may be mapped to a point of the destination surface which may be a point on or in the vicinity of the destination surface), the appropriate triangle of the flattened mesh is identified. With the triangle, embodiments work backwards and identify the triangle on the original unflattened mesh which in turn is utilized to identify the actual point on the original destination surface 404.

In other words, the mapping proceeds from the detail model to the flattened destination 404 version to the curved destination 404 version, to the original destination 404 surface. Such a reverse mapping is enabled based on the mappings (e.g., the generation of the new parameterization 1004 may result in the use of a mapping to/from the tessellated destination surface from/to the flattened tessellated destination surface) (e.g., the tessellated destination surface may produce/result in a mapping to/from the mesh representation from/to the original destination surface) obtained during the steps 1002 and 1004. In addition, a height component may also be mapped (and reversed mapped) appropriately. For example, if the reference plane is XY, then the Z component (i.e., the height component) maps to a displacement from the destination that is proportional to Z, and along the assigned normal.

As used herein, the reference plane defines the relationship of the transformed detail model 402 to the destination surface 404, and can be rotated and translated by the user. It has a distinguished point p that corresponds to the currently selected point on the destination surface 404, and an orthonormal frame of vectors $(R_1,R_2,R_3)$, where $R_1$ and $R_2$ are parallel to the reference plane, and $R_3$ is perpendicular to it.

To better understand the mapping capabilities of embodiments of the invention, including translation, rotation, scaling and elevation of the detail model with respect to the destination surface, it may be helpful to define a number of spaces and their coordinate systems as used herein. The detail model can be considered to exist in world space, which is coordinatized by XYZ (x,y,z) position coordinates. The reference plane defines reference space, which is coordinatized by a point (r, s) on the reference plane and distance t from the reference plane. The mapping between world space and reference space is defined by the relation $(x,y,z)=rR_1+sR_2+tR_3$. Parameter space is coordinatized by UVW (u,v,w) coordinates. Further, destination space is coordinatized by position on the destination surface and distance along an assigned normal at that position. These spaces are all three dimensional. UV space is a subspace of parameter space and may be coordinatized by (u,v). A point of UV space may be viewed as a point (u,v,0) in parameter space. As used herein, the flattened mesh can be viewed as lying in the (u,v,0) plane.

Continuing with FIG. 10, step 1006 is repeated for every point on the detail model 402. Accordingly, the detail model 402 is mapped to the original smooth surface in a highly accurate manner while preserving the shape of the detail model 402 (e.g., without altering the shape of the detail model 402). Thus, rather than merely mapping the detail model 402 to a mesh representation of the destination 404, embodiments of the present invention map the detail model 402 to the actual original destination 404. In addition, steps 1002-1006 may be performed dynamically and interactively in real time as the detail model 402 is manipulated with respect to the surface (e.g., as described above in the user interface).

As described above, step 1006 maps each point of the detail model onto the flattened mesh, to the curved mesh, to the original destination surface 404. For example, a point (x,y,z) in the detail model 402 may be mapped into reference space to identify reference coordinates (r,s,t), such that $(x,y,z)=rR_1+sR_2+tR_3$. These coordinates can be interpreted as a point (r,s,t) in parameter space, which can be interpreted as a point (r,s,0) and a height t. The point (r,s,0), contained in a triangle on the flattened tessellated mesh, is then mapped to the corresponding triangle in the curved mesh (or non-flattened mesh) using barycentric interpolation. The identified point on the curved mesh is then mapped to the closest point (or a projection) on the original destination surface 404. Finally, the height value t from an earlier mapping step (e.g., a distance measurement) may be used to move the identified point on the destination surface along the assigned normal at that point (e.g., proportionally). As described above, such an assigned normal may utilize a surface normal, a universal normal, or a combination of the surface and a universal normal.

This mapping process admits many variations, and is not restricted to what is described above. For example, the reference plane can implicitly be on the XY plane, and the XY plane can be identified with the UV plane of parameter space, in which case the first steps of the mapping can be collapsed. Also, as seen below, additional transformations can be added to get translation, rotation, scaling and elevation effects.

In addition, it may be noted that the closest point determination described above may be implemented in various ways that may exploit the special nature of the point at the surface. In the general case of a point and curved surface, the determination may be the same or similar to a normal projection. In a particular case, such as finding the closest point to (x,y,z) on the XY plane, embodiments may extract the coordinates (x,y). As used herein, the term closest point is intended to include projections.

Once the detail model 402 has been mapped to the actual destination surface 404 via the process above, the process will be complete and the detail model 402 is mapped while preserving the shape of the detail model 402. The system may then proceed to display the mapped detail model 402 on the destination 404 in accordance with the specified settings (e.g., by the user via the user interface methods described above).

In addition to the above, one or more embodiments may provide additional functionality. For example, after the mesh representing the destination surface is parameterized (i.e., at step 1004), the flattened mesh can be resealed in UV space so that it has the same area as the unflattened mesh. As a result, the mapping from the detail model to the destination surface can be approximately size preserving.

Embodiments of the invention may also provide the ability to translate 406 a copy of a detail model 402 along a destination surface 404, and to rotate 408, scale 410, and elevate 412. This can be achieved by inserting additional transformations in the mapping chain. Translation 406, scaling 410, and rotation 408 can be handled by transformations in parameter space, applied before mapping to the unflattened mesh. In one or more embodiments, a translation 406 is applied in parameter space so that the origin of the reference plane is mapped to a point on the destination surface 404 over which the user is dragging the mouse. Rotations 408 and scales 410 can also be applied in this space. Elevation 412, on the other hand, may be handled in the last step by adding an offset when moving a point along the assigned normal.

When translation 406, scaling 410, or rotation 408 causes the mapped detail model to extend beyond the boundary of the destination surface (e.g., as illustrated in FIG. 5), surface extrapolation techniques can be used to derive a virtual extension of the destination surface 404 for mapping purposes.

The mapping from a detail model 402 consisting of a spline surface to a destination surface 404 may yield a new surface that may not be exactly representable as a spline surface. Surface fitting techniques can be used to find a spline surface that closely approximates the new surface.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention. In summary, given a three dimensional detail model that is defined over a reference plane, embodiments of the invention solve the problem of creating a copy of the detail model that conforms to a curved destination surface yet retains the original detail model proportions.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for mapping a detail model to a destination, comprising:
    (a) obtaining a destination surface comprised of a smooth surface;
    (b) tessellating the destination surface to generate a mesh representation of the destination surface;
    (c) generating a parameterization of the mesh representation; and
    (d) reverse mapping a point of a detail model surface to a point of the destination surface via the parameterization and mesh representation, wherein:
        (i) the detail model surface comprises a three-dimensional (3D) geometry having a height component;
        (ii) the reverse mapping maps a Z-value for the height component to the destination surface;
        (iii) the reverse mapping is based on a closest point determination; and
        (iv) the point of the detail model surface is mapped to the point of the destination surface by mapping the point of the detail model surface to the parameterization, from the parameterization to the mesh representation, and from a mesh representation to a point closest to the mesh representation point on the destination surface.

2. The method of claim 1, wherein the parameterization comprises a shape preserving parameterization.

3. The method of claim 1, wherein the parameterization is unrelated to an original intrinsic parameterization of the destination surface.

4. The method of claim 1, wherein the reverse mapping is based on a normal projection.

5. The method of claim 1, further comprising:
    a user selecting the detail model surface;
    the user selecting a tool to conform the detail model surface to the destination surface;
    the user selecting the destination surface; and
    displaying the detail model surface mapped to the destination surface.

6. The method of claim 5, wherein the tool is configured to perform a translation of the detail model surface along the destination surface.

7. The method of claim 5, wherein the tool is configured to perform a rotation of the detail model surface on the destination surface.

8. The method of claim 5, wherein the tool is configured to scale the detail model surface on the destination surface.

9. The method of claim 5, wherein the tool is configured to elevate the detail model surface with respect to the destination surface.

10. The method of claim 5, further comprising displaying a slider tool that enables the user to adjust a level of shape preservation of the detail model surface based on a local destination surface normal and a universal destination surface normal.

11. An apparatus for mapping a detail model to a destination in a computer system comprising:
(a) a computer having a memory;
(b) an application executing on the computer, wherein the application is configured to
(i) obtain a destination surface comprised of a smooth surface;
(ii) tessellate the destination surface to generate a mesh representation of the destination surface;
(iii) generate a parameterization of the mesh representation; and
(iv) reverse map a point of a detail model surface to a point of the destination surface via the parameterization and mesh representation, wherein:
(1) the detail model surface comprises a three-dimensional (3D) geometry having a height component;
(2) the reverse map maps a Z-value for the height component to the destination surface;
(3) the application is configured to reverse map based on a closest point determination; and
(4) the point of the detail model surface is mapped to the point of the destination surface by mapping the point of the detail model surface to the parameterization, from the parameterization to the mesh representation, and from a mesh representation to a point closest to the mesh representation point on the destination surface.

12. The apparatus of claim 11, wherein parameterization comprises a shape preserving parameterization.

13. The apparatus of claim 11, wherein the parameterization is unrelated to an original intrinsic parameterization of the destination surface.

14. The apparatus of claim 11, wherein the application is configured to reverse map based on a normal projection.

15. The apparatus of claim 11, wherein the application is further configured to:
enable a user to select the detail model surface;
enable the user to select a tool to conform the detail model surface to the destination surface;
enable the user to select the destination surface; and
display the detail model surface mapped to the destination surface.

16. The apparatus of claim 15, wherein the tool is configured to perform a translation of the detail model surface along the destination surface.

17. The apparatus of claim 15, wherein the tool is configured to perform a rotation of the detail model surface on the destination surface.

18. The apparatus of claim 15, wherein the tool is configured to scale the detail model surface on the destination surface.

19. The apparatus of claim 15, wherein the tool is configured to elevate the detail model surface with respect to the destination surface.

20. The apparatus of claim 15, wherein the application is further configured to display a slider tool that enables the user to adjust a level of shape preservation of the detail model surface based on a local destination surface normal and an universal destination surface normal.

21. An article of manufacture comprising a non-transitory computer-readable medium encoded with a computer program, wherein the computer program embodies one or more instructions executable by the computer to perform a method for mapping a detail model to a destination in a computer system, the method comprising:
(a) obtaining a destination surface comprised of a smooth surface;
(b) tessellating the destination surface to generate a mesh representation of the destination surface;
(c) generating a parameterization of the mesh representation; and
(d) reverse mapping a point of a detail model surface to a point of the destination surface via the parameterization and mesh representation, wherein:
(i) the detail model surface comprises a three-dimensional (3D) geometry having a height component;
(ii) the reverse mapping maps a Z-value for the height component to the destination surface;
(iii) the reverse mapping is based on a closest point determination; and
(iv) the point of the detail model surface is mapped to the point of the destination surface by mapping the point of the detail model surface to the parameterization, from the parameterization to the mesh representation, and from a mesh representation to a point closest to the mesh representation point on the destination surface.

22. The article of manufacture of claim 21, wherein the parameterization comprises a shape preserving parameterization.

23. The article of manufacture of claim 21, wherein the parameterization is unrelated to an original intrinsic parameterization of the destination surface.

24. The article of manufacture of claim 21, wherein the reverse mapping is based on a normal projection.

25. The article of manufacture of claim 21, the method further comprising:
a user selecting the detail model surface;
the user selecting a tool to conform the detail model surface to the destination surface;
the user selecting the destination surface; and
displaying the detail model surface mapped to the destination surface.

26. The article of manufacture of claim 25, wherein the tool is configured to perform a translation of the detail model surface along the destination surface.

27. The article of manufacture of claim 25, wherein the tool is configured to perform a rotation of the detail model surface on the destination surface.

28. The article of manufacture of claim 25, wherein the tool is configured to scale the detail model surface on the destination surface.

29. The article of manufacture of claim 25, wherein the tool is configured to elevate the detail model surface with respect to the destination surface.

30. The article of manufacture of claim 25, the method further comprising displaying a slider tool that enables the user to adjust a level of shape preservation of the detail model surface based on a local destination surface normal and an universal destination surface normal.

31. The method of claim 1, wherein the reverse mapping comprises:
mapping the point of the detail model surface to a point on the parameterization of the mesh representation;
mapping the point on the parameterization of the mesh representation to a point on the mesh representation; and
mapping the point on the mesh representation to a point on the destination surface.

\* \* \* \* \*